United States Patent [19]

Ohike

[11] Patent Number: 5,138,968
[45] Date of Patent: Aug. 18, 1992

[54] CROSS COIL-SHAPED INDICATING INSTRUMENT

[75] Inventor: Yukio Ohike, Shimada, Japan

[73] Assignee: Yazaki Corporation, Tokyo, Japan

[21] Appl. No.: 728,282

[22] Filed: Jul. 11, 1991

[30] Foreign Application Priority Data

Jul. 12, 1990 [JP] Japan .................. 2-73362[U]

[51] Int. Cl.$^5$ .................... G01D 11/16; G01R 1/20
[52] U.S. Cl. ........................ 116/294; 116/284; 116/305; 324/146; 324/151 A; 324/156
[58] Field of Search ............ 116/284, 291, 294, 297, 116/305, 62.4; 324/154 PB, 154 R, 146, 151 A, 156, 157; 335/272, 274, 222

[56] References Cited

U.S. PATENT DOCUMENTS

| | | | |
|---|---|---|---|
| 2,668,945 | 2/1954 | Pfeffer | 324/146 |
| 2,816,255 | 12/1957 | Greif | 324/151 A |
| 3,159,788 | 12/1964 | Donko | 324/146 |
| 3,327,208 | 6/1967 | Allen | 324/146 |
| 3,855,532 | 12/1974 | Woodward | 324/154 R |
| 4,090,131 | 5/1978 | Mas | 324/146 |
| 4,646,007 | 2/1987 | Faria | 116/297 X |
| 4,878,453 | 11/1989 | Inoue et al. | 116/DIG. 6 X |
| 4,906,919 | 3/1990 | Sato et al. | 324/154 R |
| 4,988,944 | 1/1991 | Ito | 324/154 PB |
| 5,017,862 | 5/1991 | Brooks | 324/154 R |

FOREIGN PATENT DOCUMENTS

| | | | |
|---|---|---|---|
| 0085366 | 4/1988 | Japan | 324/146 |
| 0090063 | 3/1990 | Japan | 324/146 |

Primary Examiner—William A. Cuchlinski, Jr.
Assistant Examiner—John L. Beres
Attorney, Agent, or Firm—Fleit, Jacobson, Cohn, Price, Holman & Stern

[57] ABSTRACT

A cross coil-shaped indicating instrument includes a cross coil structure in which two coils are wound around a coil bobbin at right angles to each other. The coil structure is electrically charged in correspondence to the amount measured so as to form a composite magnet. A magnet rotor is disposed inside the cross coil structure. The magnet rotor has a center rotary shaft rotatable at a predetermined angle in correspondence to the composite magnetic field. A pointer is fixed to the end of the rotary shaft. In order to press the pointer into an appropriate position with respect to the rotary shaft, a pressure recess is formed in the coil bobbin so that a rod-like fixture can be inserted into the recess, and a stopper projects inside the pressure recess to press against the magnet rotor when the fixture is inserted. The stopper makes the magnet rotor stationary. While the rotary shaft remains stationary, the pointer can be fixed to an predetermined indicating position.

3 Claims, 2 Drawing Sheets

CROSS COIL-SHAPED INDICATING INSTRUMENT

BACKGROUND OF THE INVENTION

1. Field of the Invention

The present invention relates to a cross coil-shaped indicating instrument and, more particularly, to a cross coil-shaped indicating instrument suitably used for the speedometer of an automobile or the like.

2. Description of the Related Art

A number of indicating instruments for automobiles have hitherto been employed in which an electric current, whose quantity is altered in correspondence to the amount measured, is passed to a pair of coils that generate magnetic fields perpendicular to each other. A magnet rotor is rotated in a direction of a composite magnetic field composed of the magnetic fields generated by the pair of coils. A pointer attached to a rotary shaft at one end thereof indicates the amount measured, the rotary shaft being rotatable together with the magnet rotor.

To fix the pointer of such a conventional type of indicating instrument to the rotary shaft, first, the rotary shaft is temporarily pressed into the pointer. Under this condition, an electric current equal to a predetermined rotation angle is fed to a cross coil. In the case of, for instance, a speedometer, an electric current corresponding to, for example, 40 km/hour, is supplied. While the electric current is being supplied and the rotary shaft remains stationary, the position of the pointer is adjusted so that it indicates an indicating position of an indicator face. While such a position of the pointer is being maintained, the rotary shaft is pressed into the pointer The appropriately adjusted position of the pointer can thus be maintained.

As mentioned above, an electric current equal to the predetermined rotation angle is fed to the cross coil of the conventional indicating instrument. While the rotary shaft is being maintained at a predetermined rotation position by only the magnetic force of the cross coil, the position of the pointer is adjusted After this adjustment has been made, the rotary shaft is pressed into the pointer. Therefore, when the external peripheral surface of the rotary shaft or the internal surface of the pointer, into which the rotary shaft is pressed, is damaged, it is difficult for the pointer to be fitted onto the rotary shaft due to this damage; or when a pressure load deviates from the center of the rotary shaft, the rotary shaft is pressed into the pointer while the former is rotated slightly with respect to the appropriate position of the latter in response to the pressure load As a result, the pointer is fixed to a position deviating from the predetermined indicating position, rendering the indication characteristics inaccurate and making it impossible to accurately indicate the amount measured.

The present invention has been made in view of the above problems. The object of the invention is therefore to provide a cross coil-shaped indicating instrument which is capable of being pressed into an appropriate position with respect to a rotary shaft and of obtaining accurate indication characteristics.

SUMMARY OF THE INVENTION

To achieve the above object, the present invention provides a cross coil-shaped indicating instrument in which a cross coil is constructed by winding two coils around a coil bobbin at right angles to each other. A magnet rotor is disposed inside the cross coil so that it is rotatable around the rotary shaft having one end to which a pointer is fixed. The magnet rotor is rotatively driven at a predetermined angle in accordance with a composite magnetic field which is generated by the respective coils when the coils are electrically charged. A pressure recess into which a rod-like fixture is inserted is formed in the coil bobbin, and a stopper projects inside the pressure recess to press against the magnet rotor when the fixture is inserted.

According to this invention, to fix the pointer to the rotary shaft, while an electric current equal to a predetermined rotation angle is supplied to the cross coil, the fixture is inserted into the pressure recess. The stopper thereby presses against the external peripheral surface of the magnet rotor to fix the magnet rotor. Under the above conditions, the position of the pointer is adjusted so that it points to a predetermined indicating position, and the rotary shaft is pressed into the pointer. Therefore, even when the external peripheral surface of the rotary shaft is damaged or otherwise non-functional, the rotary shaft will not be rotated. The rotary shaft can be pressed into the pointer with certainty. As a result, the pointer can be appropriately secured to the predetermined indicating position. It is thus possible for the pointer to accurately indicate the amount measured.

DESCRIPTION OF THE PREFERRED EMBODIMENT

The present invention will be described below in detail according to the embodiment shown in the accompanying drawings.

Figure 1:
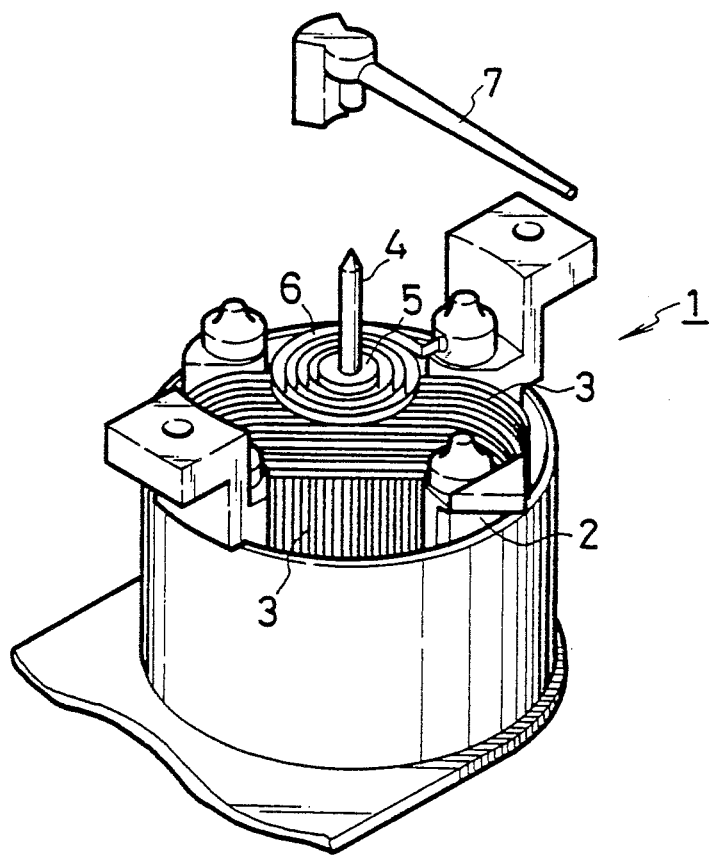
FIG. 1 is a perspective view schematically showing the movement of a typical cross coil-shaped indicating instrument.

With reference to FIG. 1, numeral 1 generally depicts the typical movement 1 of a cross coil-shaped indicating instrument used for various instrument units such as a speedometer. The movement 1 is provided with a coil bobbin 2 around which two coils 3 are wound at right angles to each other.

Figure 2:
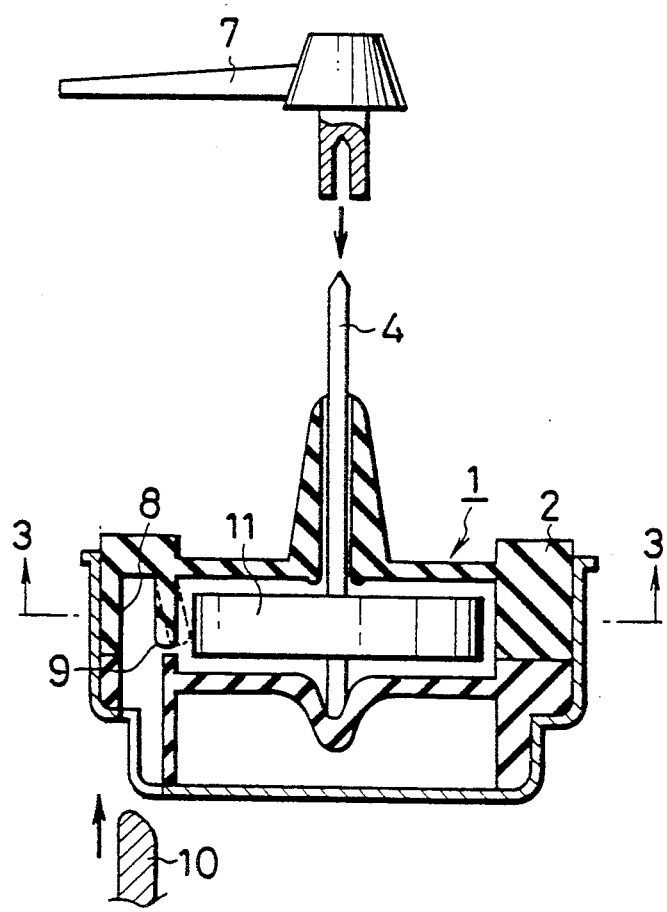
FIG. 2 is a longitudinal cross-sectional view essentially showing the present invention in which an embodiment of the movement of such an indicating instrument is illustrated.
Figure 3:
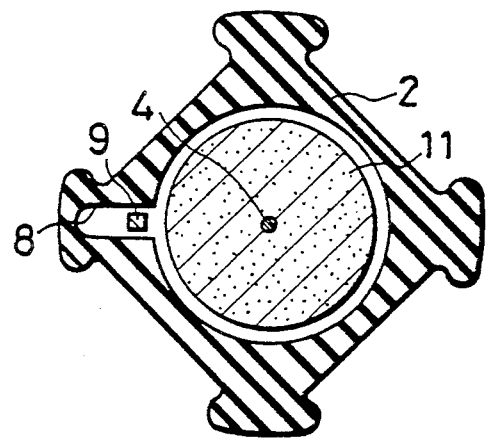
FIG. 3 is a cross-sectional view along line 3—3 of FIG. 2.

Referring to FIG. 2, a pressure recess 8 is formed in the internal peripheral surface of the coil bobbin 2, which recess 8 extends outwardly in a radial direction and opens at the lower end of the coil bobbin 2. A stopper 9 extending downwardly is disposed in a position corresponding to the inside of the pressure recess 8, and projects from the internal upper portion of the coil bobbin 2. A rod-like fixture 10 can be inserted upwardly into the pressure recess 8, thereby bending the stopper 9 inwardly.

A disk-like magnet rotor 11, composed of an S-pole and an N-pole, is arranged inside the respective coils 3. A rotary shaft 4, extending in the same direction as the shaft of the coil bobbin 2, is rotatably attached to the center of the magnet rotor 11. When the respective coils 3 are not electrically charged, the magnet rotor 11 is free to rotate about the rotary shaft 4. When the individual coils 3, on the contrary, are electrically charged, the magnet rotor 11 is rotatively driven at a predetermined angle.

A collet 5 is fitted under pressure around the upper portion of the rotary shaft 4. One end of a hair spring 6 is secured to the periphery of the collet 5, the other end being connected to the side of the coil bobbin 2. When the coils 3 are not electrically charged and the magnet rotor is free to rotate, the hair spring 6 energizes the rotary shaft 4 so that it returns to a predetermined position "0".

An indicator face (not shown) is disposed over the movement 1 thus constructed. A pointer 7 is secured at the portion of the rotary shaft 4 which protrudes from the indicator face. The instrument unit is constructed as described above.

The operation of this embodiment will now be explained.

First, the rotary shaft 4 is temporarily pressed into the pointer 7, and an electric current equal to a predetermined rotation angle is fed to the cross coil. For example, in the case of a speedometer, an electric current corresponding to, for instance, 40 km/hour, is supplied.

Thereafter, when the electric current is being fed, the fixture 10 is inserted into the pressure recess 8, thereby bending the stopper 9 inwardly, as indicated by a broken line in FIG. 2. This bending causes the stopper 9 to press against the external peripheral surface of the magnet rotor 11 so as to fix the magnet rotor 11. When the rotary shaft 4 remains stationary, the position of the pointer 7 is adjusted so that it points to an indicating position of the indicator face corresponding to the pointer 7. While such a position of the pointer 7 is being maintained, the rotary shaft 4 is pressed into the pointer 7, whereby the appropriately adjusted position of the pointer 7 can be maintained. After the pointer 7 has been fixed, the fixture 10 is withdrawn from the pressure recess 8. Because of the elasticity, the stopper 9 returns to its original position, drawing away from the magnet rotor 11. Thus the magnet rotor 11 is not stationary any longer.

In this embodiment, a predetermined electric current is supplied to the respective coils 3 based on a predetermined, measured signal of the speed of an automobile or the like. In accordance with a composite magnetic field composed of magnetic fields generated by the respective coils 3, the magnet rotor 11 is rotated through an angle corresponding to the amount measured, thus causing the rotary shaft 4 to rotate. The pointer 7 is thereby rotated in relation to the indicator face to indicate the amount measured. When the respective coils 3 are not electrically charged, as when an automobile is stopped, the magnet rotor 11 is free to rotate, and the pointer 7 is returned to the position "0" by the energy acting on the hair spring 6, attached to the rotary shaft 4.

As mentioned above, in this embodiment, to fix the pointer 7 to the rotary shaft 4, the fixture 10 is inserted into the pressure recess 8, thus bending the stopper 9 inwardly. This bending permits the stopper 9 to press against the external peripheral surface of the magnet rotor 11 so as to fix the magnet rotor 11, and thereby the rotary shaft 4. Therefore, even when the external peripheral surface of the rotary shaft 4 is damaged or otherwise nonfunctional, the rotary shaft 4 will not be rotated. The rotary shaft 4 can be pressed into the pointer 7 with certainty. As a result, the pointer 7 can be appropriately secured to the predetermined indicating position, and it can accurately indicate the amount measured.

The pressure recess 8 and the stopper 9 are not necessarily disposed in the positions mentioned in the above embodiment. For example, a recess may also be formed at the bottom of the coil bobbin 2 where the coils are not housed, or a stopper may also be disposed so as to press against the bottom of the magnet rotor 11.

As has been described above, to fix the pointer to the rotary shaft, the fixture is inserted into the pressure recess. The stopper fixes the magnet rotor, thus making the rotary shaft stationary. Therefore, even when the external peripheral surface of the rotary shaft is damaged or otherwise non-functional, the rotary shaft will not be rotated. The rotary shaft can thus be pressed into the pointer with certainty. As a result, the cross coil-shaped indicating instrument of this invention has the advantage that the pointer can be appropriately secured to the predetermined indicating position. It is thus possible for the pointer to accurately indicate the amount measured, while preventing deviation from the indication characteristics.

What is claimed is:

1. A cross coil-shaped indicating instrument comprising:
   a cross coil structure in which two coils are wound around a coil bobbin at right angles to each other, said coil structure being electrically charged in corresponding to a measured amount so as to form a composite magnetic field composed of magnetic fields generated by the respective coils;
   a magnet rotor disposed inside said cross coil structure, said magnet rotor having a center rotary shaft rotatable at a predetermined angle in correspondence to the composite magnetic field;
   a pointer fixed to the end of the rotary shaft; and
   means for pressing said pointer into an appropriate position with respect to the rotary shaft, said means for pressing said pointer including a pressure recess formed in the coil bobbin for inserting a rod-like fixture into said pressure recess, and a stopper formed in said pressure recess for pressing against said magnet rotor when the fixture is inserted.

2. A cross coil-shaped indicating instrument according to claim 1, wherein said pressure recess is provided in an internal peripheral surface of the coil bobbin, and said stopper is provided so as to press against an external peripheral surface of said magnet rotor.

3. A cross coil-shaped indicating instrument comprising:
   a cross coil structure in which two coils are wound around a coil bobbin at right angles to each other, said coil structure being electrically charged in correspondence to the amount measured so as to form a composite magnetic field composed of magnetic fields generated by the respective coils;
   a magnet rotor disposed inside said cross coil structure, said magnet rotor having a center rotary shaft rotatable at a predetermined angle in correspondence to the composite magnetic field;
   a pointer fixed to the end of the rotary shaft; and
   means for pressing said pointer into an appropriate position with respect to the rotary shaft that includes a pressure recess provided in an internal peripheral surface of the coil bobbin for inserting a rod-like fixture into the pressure recess which opens at a lower end of the coil bobbin; and a stopper formed in a position corresponding to the inside of the pressure recess so as to project downwardly from an upper internal portion of the coil bobbin, the stopper pressing against an external peripheral surface of said magnet rotor when the fixture is inserted.

* * * * *